United States Patent
Yu et al.

(10) Patent No.: US 7,701,718 B2
(45) Date of Patent: Apr. 20, 2010

(54) HEAT SINK ASSEMBLY

(75) Inventors: Jian-Ping Yu, Shenzhen (CN); Cui-Jun Lu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 23 days.

(21) Appl. No.: 12/235,611

(22) Filed: Sep. 23, 2008

(65) Prior Publication Data

US 2010/0073877 A1 Mar. 25, 2010

(51) Int. Cl.
*H05K 7/20* (2006.01)
*F28D 15/00* (2006.01)

(52) U.S. Cl. .................. 361/700; 165/104.33; 165/122; 361/695; 361/697

(58) Field of Classification Search ............ 165/104.33; 361/695, 697, 700
See application file for complete search history.

(56) References Cited

U.S. PATENT DOCUMENTS

| | | | | |
|---|---|---|---|---|
| 6,745,824 B2* | 6/2004 | Lee et al. | | 165/104.14 |
| 6,976,525 B2* | 12/2005 | Lin | | 165/80.3 |
| 7,042,719 B2* | 5/2006 | Lai | | 361/679.21 |
| 7,206,207 B2* | 4/2007 | He | | 361/825 |
| 7,342,719 B1* | 3/2008 | Kalmanash et al. | | 359/452 |
| 7,362,573 B2* | 4/2008 | Lu et al. | | 361/695 |
| 2002/0080582 A1* | 6/2002 | Chang | | 361/700 |
| 2006/0028798 A1* | 2/2006 | Wang | | 361/697 |

* cited by examiner

*Primary Examiner*—Gregory D Thompson
(74) *Attorney, Agent, or Firm*—Frank R. Niranjan

(57) ABSTRACT

A heat sink assembly includes a base, a fin group located above a top of the base, a mounting bracket, and a fan mounted on a lateral side of the mounting bracket. The mounting bracket is integrally formed by a metal sheet. The mounting bracket includes a pedestal is located at a top of the base and connects with the base, and two sidewalls extending upwardly from opposite ends of the pedestal and sandwiching the fin group therebetween. The fan is mounted on a lateral side of the sidewalls of the mounting bracket. The pedestal integrally forms four mounting arms. Four fasteners extend through the mounting arms for securing the heat sink assembly to a printed circuit board.

14 Claims, 4 Drawing Sheets

HEAT SINK ASSEMBLY

BACKGROUND OF THE INVENTION

1. Field of the Invention

The present invention relates to a heat sink assembly, and more particularly to a heat sink assembly having a mounting bracket, which is integrally formed by a metal sheet to engage with a heat sink and a fan. The mounting bracket can be used for both mounting the heat sink assembly to a printed circuit board and guiding an airflow generated by the fan through fins of the heat sink.

2. Description of Related Art

Typically, a heat sink assembly is mounted on a printed circuit board and contacts heat-generating components to dissipate heat generated by the heat-generating components. The heat sink assembly comprises a heat sink having a base and a plurality of fins mounted on the base, a fan duct mounted on the base of the heat sink and enclosing the fins of the heat sink therein, and a fan mounted on a side of the fan duct. A receiving portion is formed on the base. An engaging portion is formed on the fan duct corresponding to the receiving portion of the base. The fan duct and the base of the heat sink are assembled together via the engaging portion of the fan duct and the receiving portion of the base engaging with each other. To form the engaging portion and the receiving portion separately is costly. Furthermore, to connect the engaging portion and the receiving portion together is time-consuming, troublesome and inconvenient. The engaging portion and receiving portion are prone to be disassembled from each other due to vibration during operation of the fan.

Thus, it is desired to devise a heat sink assembly which has a mounting bracket having a structure for facilitating a firm fastening of a fan to the heat sink assembly and a firm mounting of the heat sink assembly to a printed circuit board.

SUMMARY OF THE INVENTION

A heat sink assembly includes a base, a fin group located above a top of the base, a mounting bracket, and a fan mounted on a lateral side of the mounting bracket. The mounting bracket is integrally formed by a metal sheet. The mounting bracket includes a pedestal is located at a top of the base and connects with the base, and two sidewalls extending upwardly from opposite ends of the pedestal and sandwiching the fin group therebetween. The fan is mounted on a lateral side of the sidewalls of the mounting bracket. The mounting bracket forms four mounting arms each be mounted with a fastener for securely mounting the heat sink assembly on an electronic device.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
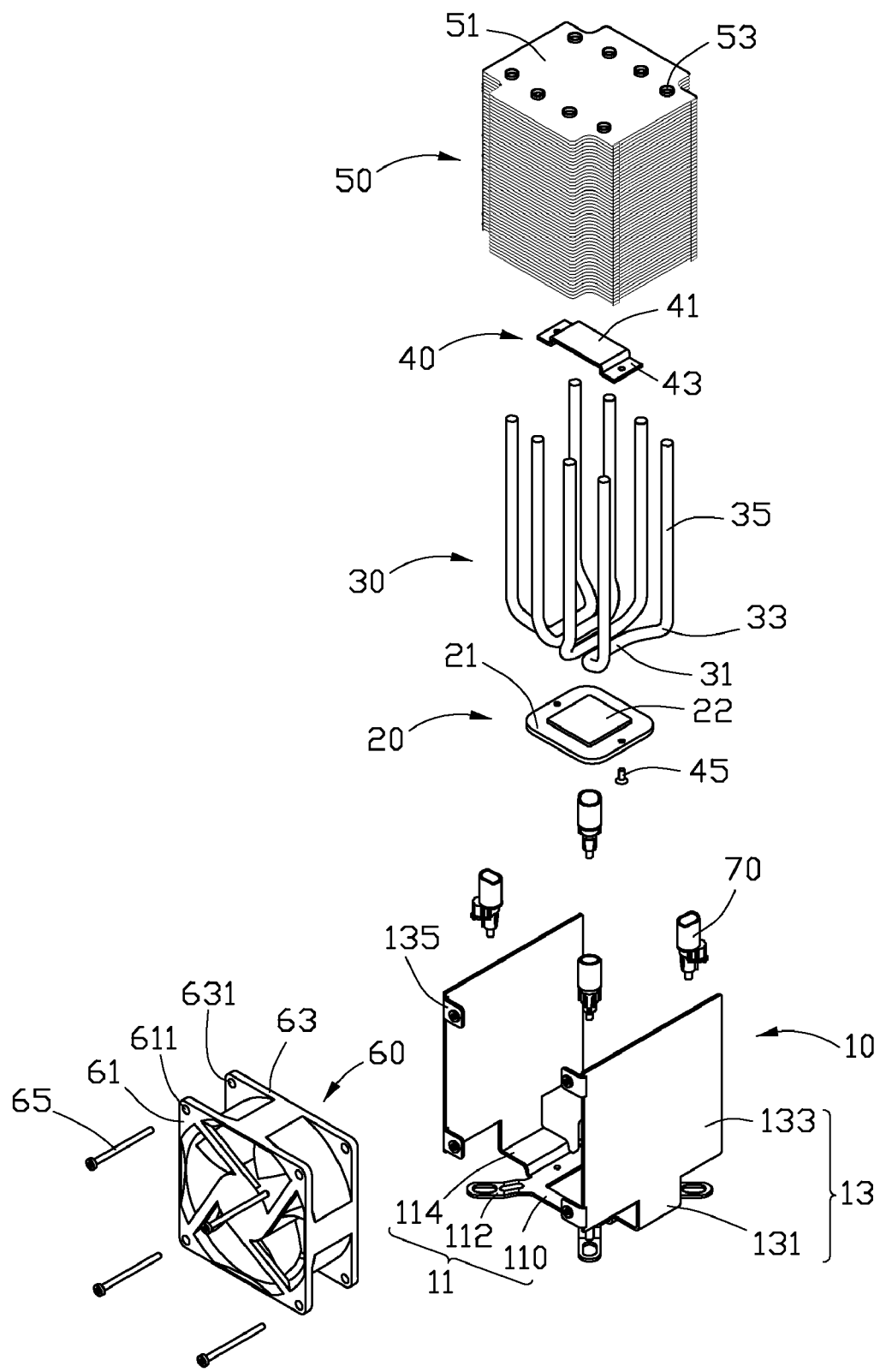
FIG. 1 is an exploded, isometric view of a heat sink assembly in accordance with a preferred embodiment of the present invention.
Figure 2:
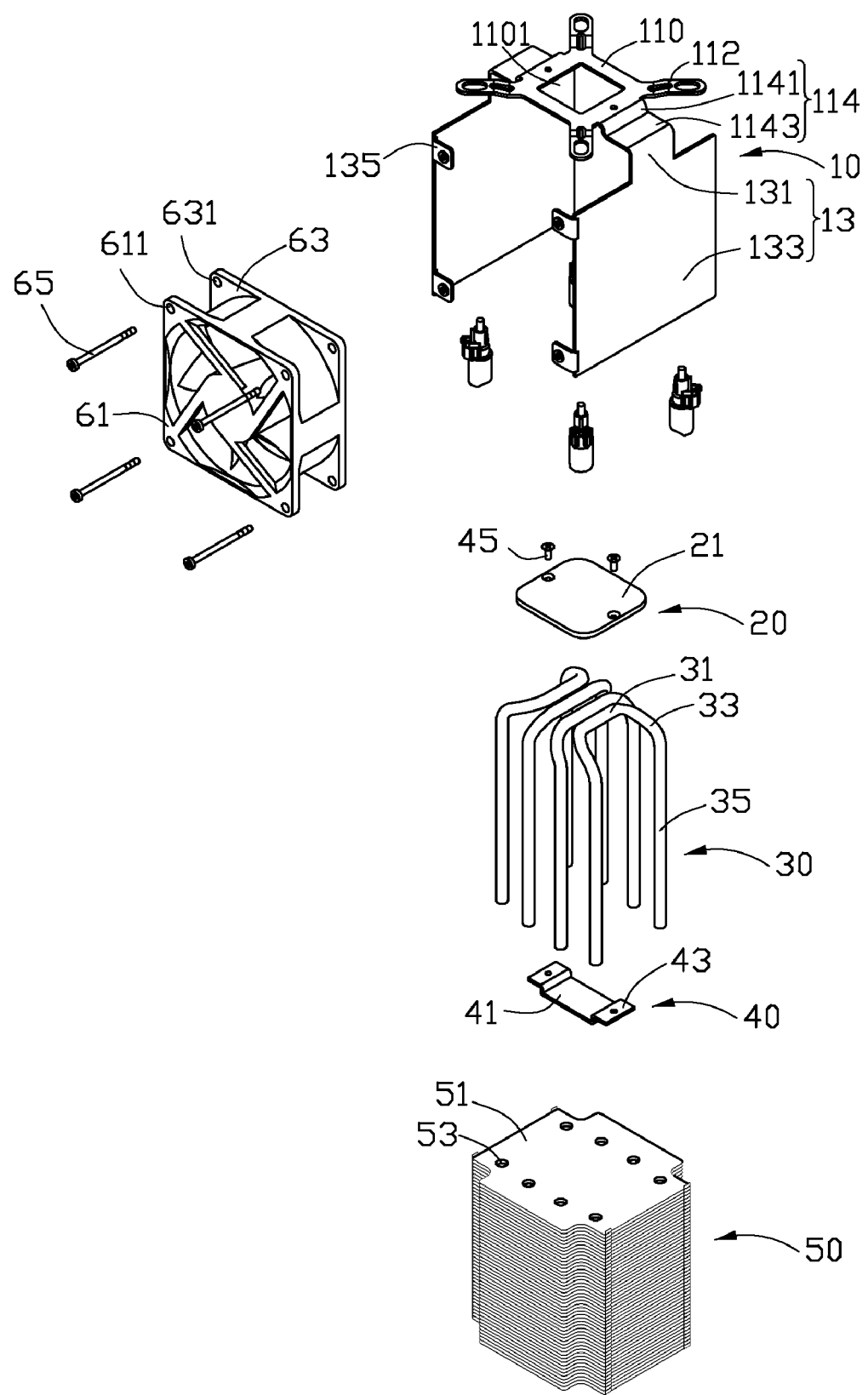
FIG. 2 is an inverted view of FIG. 1.

Referring to FIGS. 1-2, a heat sink assembly in accordance with a preferred embodiment of the present invention comprises a base 20, a fin group 50 located at a top of the base 20, four U-shaped heat pipes 30 connecting with the base 20 and the fin group 50, a mounting bracket 10 located at a top of the base 20 and enclosing the fin group 50 and the heat pipes 30 therein, and a fan 60 mounted on a lateral side of the mounting bracket 10.

The mounting bracket 10 is integrally formed by a metal sheet and comprises a pedestal 11 and a pair of sidewalls 13 extending upwardly from opposite ends of the pedestal 11, respectively. The pedestal 11 comprises a rectangular engaging portion 110 with a rectangular opening 1101 defined therein, four mounting arms 112 extending slantwise from four corners of the engaging portion 110, and a pair of bended extending portions 114 extending upwardly and outwardly from opposite edges of the engaging portion 110. Four fasteners 70 extend through the mounting arms 112, respectively, for locking with a back plate (not shown) located under a printed circuit board (not shown) on which a heat-generating electronic component (not shown) such as a CPU is mounted. By the locking between the four fasteners 70 and the back plate, the heat sink assembly in accordance with the present invention can have an intimate contact with the heat-generating electronic component. Each extending portion 114 has an L-shaped configuration and comprises a first extending plate 1141 extending perpendicularly and upwardly from the edge of the engaging portion 110 and a second extending plate 1143 extending perpendicularly and outwardly from an edge of the first extending plate 1141. Each sidewall 13 perpendicularly and upwardly extends from the second extending plate 1143 of a corresponding extending portion 114. The sidewall 13 comprises a mounting plate 133 and a connecting plate 131 connecting the mounting plate 133 with the second extending plate 1143 of the extending portion 114. The connecting plate 131 is smaller than the mounting plate 133 and connects a central portion of a bottom of the mounting plate 133. A pair of mounting tabs 135 are formed on top and bottom ends of the mounting plate 133 to engage with the fan 60. The mounting tabs 35 are bent perpendicularly from the top and bottom ends of the mounting plate 133. The mounting plates 133 sandwich the fin group 50 therebetween and act as a fan duct.

The base 20 has a T-shaped section and comprises a contacting plate 21 and a protruding plate 22 extending upwardly from a center of the contacting plate 21. A top surface of the contacting plate 21 connects with a bottom surface of the engaging portion 110 of the pedestal 11 of the mounting bracket 10. The protruding plate 22 extends through the opening 1101 of the pedestal 11 of the mounting bracket 10 to contact with the heat pipes 30.

Each heat pipe 30 comprises a horizontal evaporating portion 31, a pair of bended connecting portions 33 extending upwardly from opposite ends of the evaporating portion 31 respectively, and a pair of vertical condensing portions 35 extending upwardly from the connecting portions 33 respectively. The evaporating portions 31 thermally contact with the protruding plate 22 of the base 20. The condensing portions 35 engage with the fin group 50.

A bended securing plate 40 spans across the evaporating portions 31 of the heat pipes 30 and engages with the engaging portion 110 of the pedestal 11 of the mounting bracket 10 to secure the heat pipes 30 on the mounting bracket 10. The securing plate 40 comprises a pressing plate 41 and a pair of mounting plates 43 extending downwardly and outwardly from opposite ends of the pressing plate 41. The pressing plate 41 spans across the evaporating portions 31 of the heat pipes 30 and the mounting plates 43 contact with a top surface of the engaging portion 110 of the pedestal 11 of the mounting bracket 10. Two screws 45 extend through the engaging portion 110, the contacting plate 21 of the base 20 and the mounting plates 43 of the securing plate 40 to secure the base 20 and the securing plate 40 to the mounting bracket 10.

Figure 3:
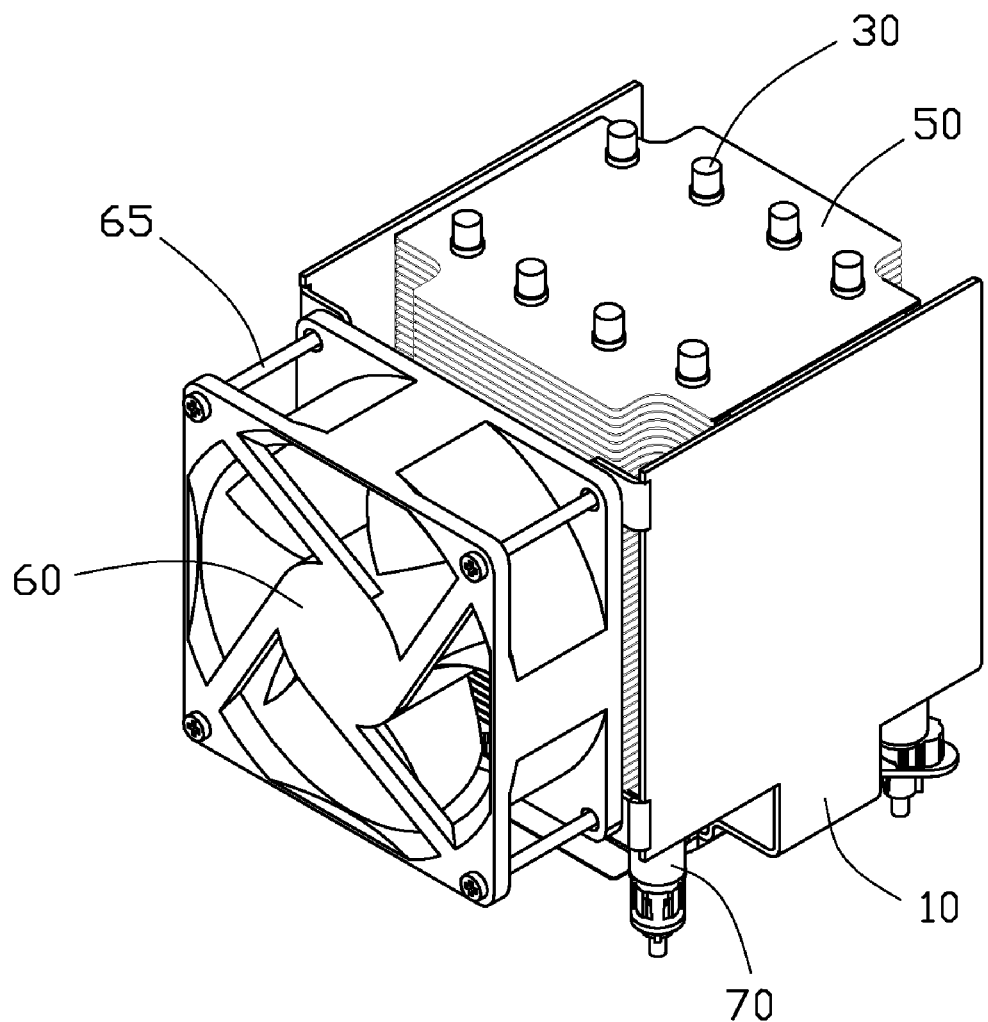
FIG. 3 is an assembled view of FIG. 1.
Figure 4:
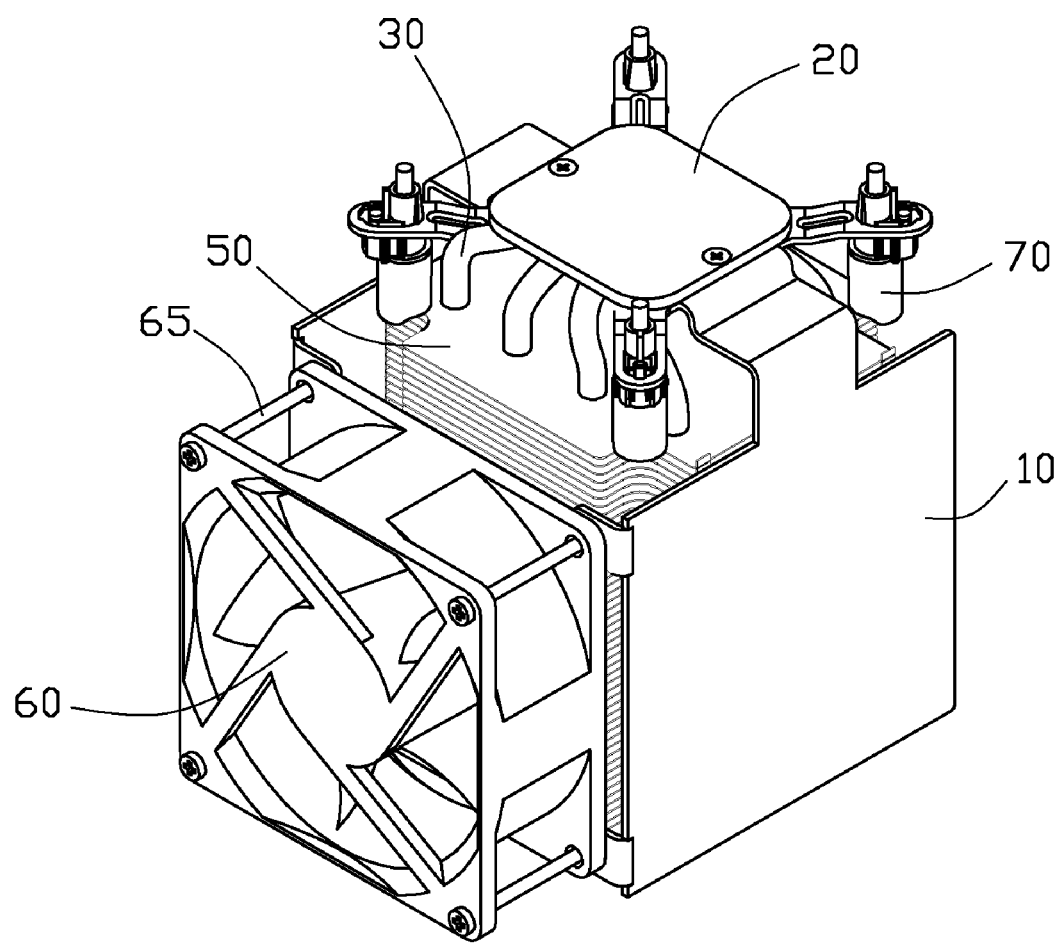
FIG. 4 is an inverted view of FIG. 3.

Referring to FIGS. 3-4 also, the fin group 50 is sandwiched between the mounting plates 133 of the sidewalls 13. A height of the fin group 50 is slightly less than that of the mounting plate 133 of the sidewall 13. A width of the fin group 50 is slightly less than that of the mounting plate 133 of the sidewall 13. The fin group 50 comprises a plurality of parallel fins 51. Each fin 11 clasps an adjacent one therebelow to form the fin group 50. Each fin 11 defines four pairs of through holes 53 at lateral sides therein. The condensing portions 35 extend through the through holes 53 of the fins 51 of the fin group 50 and are soldered to the fins 51. Thus, the fin group 50 and the condensing portions 35 are combined together. A bottom fin 51 of the fin group 50 abuts against the connecting portions 33 of the heat pipes 30 and is spaced from protruding plate 22 of the base 20.

The fan 60 is located at the lateral side of the mounting bracket 10. The fan 60 has a rectangular configuration and comprises a first and a second flanges 61, 63. Each corner of the first and second flanges 61, 63 defines a through hole 611, 631, respectively. Four elongated screws 65 extend through the through holes 611, 631 of the first and second flanges 63, 61 in series and engage with the mounting tabs 135 of the sidewalls 13 of the mounting bracket 10 to mount the fan 60 on the mounting bracket 10.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A heat sink assembly comprising:
   a base;
   a fin group located above a top of the base;
   a mounting bracket integrally formed by a metal sheet, the mounting bracket comprising a pedestal located at the a bottom of the base and connecting with the base and a sidewall that extends upwardly from opposite ends of the pedestal and sandwiching the fin group therebetween; and
   a fan mounted on a lateral side of the sidewalls of the mounting bracket;
   wherein the pedestal is integrally formed with at least a mounting arm mounted with at least a fastener adapted for securing with a printed circuit board.

2. The heat sink assembly as claimed in claim 1, wherein a height of the fin group is slightly less than that of each of the sidewalls.

3. The heat sink assembly as claimed in claim 1, wherein a width of the fin group is slightly less than that of each of the sidewalls.

4. The heat sink assembly as claimed in claim 1, wherein each of the sidewalls forms two spaced mounting tabs to engage with the fan, the mounting tabs being perpendicular to the each of the side walls.

5. The heat sink assembly as claimed in claim 4, wherein each of the sidewalls comprises a mounting plate and a connecting plate connecting the mounting plate with the pedestal, the mounting tabs being formed on the mounting plate.

6. The heat sink assembly as claimed in claim 1 further comprising a plurality of heat pipes, each of the heat pipes having an evaporating portion thermally contacting with the base and a pair of condensing portions extending through the fin group.

7. The heat sink assembly as claimed in claim 6, wherein each of the heat pipes comprises a pair of connecting portions interconnecting the evaporating portion with the condensing portion, and a bottom fin of the fin group abuts against the connecting portions of the heat pipes and spaced from the base.

8. The heat sink assembly as claimed in claim 6, wherein the base comprises a contacting plate connecting with the pedestal and a protruding plate extending through the pedestal and thermally contacting with the evaporating portions of the heat pipes.

9. The heat sink assembly as claimed in claim 6, wherein a bended securing plate spans across the evaporating portions of the heat pipes and engages with the pedestal of the mounting bracket to secure the heat pipes on the mounting bracket.

10. The heat sink assembly as claimed in claim 1, wherein the pedestal comprises a rectangular engaging portion, the base connecting with the engaging portion of the pedestal.

11. The heat sink assembly as claimed in claim 10, wherein the pedestal comprises a pair of extending portions extend upwardly and outwardly from opposite edges of the engaging portion of the pedestal, the sidewalls extending upwardly from the extending portions.

12. The heat sink assembly as claimed in claim 1, wherein the at least a mounting arm extends outwardly from the rectangular engaging portion.

13. A heat sink assembly comprising:
   a mounting bracket formed by bending a monolithic metal plate and having a rectangular engaging portion at a bottom thereof and a pair of sidewalls extending upwardly from the rectangular engaging portion, four mounting arms extending integrally and outwardly from four corners of the rectangular engaging portion, each mounting arm being mounted with a fastener adapted for securing with a printed circuit board;
   a fin assembly mounted between the sidewalls of the mounting bracket; and
   a fan mounted to the sidewalls of the bracket and in front of a side of the fin assembly, wherein the sidewalls guide an airflow generated by the fan through the fin assembly.

14. The heat sink assembly as claimed in claim 13 further comprising a base attached to a bottom of the engaging portion of the mounting bracket, the base having a protruding plate extending upwardly from a central portion of the base through the engaging portion, a plurality of heat pipes each having an evaporating portion thermally connecting with the protruding plate and a condensing section extending upwardly from the evaporating portion through the fin assembly.

* * * * *